US012318870B2

(12) United States Patent
Kim

(10) Patent No.: US 12,318,870 B2
(45) Date of Patent: Jun. 3, 2025

(54) BALL ATTACHMENT APPARATUS

(71) Applicant: Samsung Electronics Co., Ltd., Suwon-si (KR)

(72) Inventor: Youngja Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/243,805

(22) Filed: Sep. 8, 2023

(65) Prior Publication Data
US 2024/0207961 A1 Jun. 27, 2024

(30) Foreign Application Priority Data

Dec. 22, 2022 (KR) .................. 10-2022-0181861
Apr. 12, 2023 (KR) .................. 10-2023-0048047

(51) Int. Cl.
B23K 3/00 (2006.01)
B23K 3/06 (2006.01)
H05K 3/34 (2006.01)
B23K 101/42 (2006.01)

(52) U.S. Cl.
CPC ............ *B23K 3/0623* (2013.01); *H05K 3/34* (2013.01); *B23K 2101/42* (2018.08)

(58) Field of Classification Search
CPC ........ B23K 3/0623; B23K 2101/36–42; B23K 1/0016; B23K 3/06–0607; B23K 35/0244; H05K 3/34
USPC .............................. 228/41, 180.22, 245–246
See application file for complete search history.

(56) References Cited

U.S. PATENT DOCUMENTS

| 6,253,992 B1* | 7/2001 | Fjelstad | H01L 21/4853 |
| | | | 228/56.3 |
| 6,533,160 B1* | 3/2003 | Bourrieres | H01L 24/11 |
| | | | 228/41 |
| 8,434,664 B2* | 5/2013 | Aoya | H01L 24/83 |
| | | | 438/626 |
| 2003/0042287 A1* | 3/2003 | Inoue | B23K 3/0623 |
| | | | 228/49.5 |
| 2009/0108053 A1* | 4/2009 | Huddleston | H01L 24/742 |
| | | | 228/41 |

(Continued)

FOREIGN PATENT DOCUMENTS

| CN | 106664804 A * | 5/2017 | ........ H01L 23/49811 |
| CN | 109103116 A * | 12/2018 | ........... B23K 1/0016 |

(Continued)

*Primary Examiner* — Kiley S Stoner
(74) *Attorney, Agent, or Firm* — Muir Patent Law, PLLC

(57) ABSTRACT

A ball attachment apparatus includes a tool case having a bottom surface on which solder balls are adsorbed for attachment to a substrate strip including a plurality of substrate units, a plurality of holding tools in the tool case spaced apart from each other in a first direction, including a plurality of holding regions disposed in the tool case each including adsorption holes, the holding regions respectively corresponding to the substrate units and the adsorption holes respectively corresponding to ball pads of the substrate units, and a plurality of insertion blocks respectively disposed between adjacent ones of the holding tools, wherein, among gaps between the holding tools, a first gap at a first distance from a center of the tool case is different from at least one second gap at a second distance greater than the first distance from the center of the tool case.

20 Claims, 16 Drawing Sheets

(56) References Cited

U.S. PATENT DOCUMENTS

| | | | |
|---|---|---|---|
| 2009/0298278 A1 | 12/2009 | Tu et al. | |
| 2014/0339291 A1* | 11/2014 | Chen | B23K 3/0623 |
| | | | 228/248.1 |
| 2015/0328707 A1* | 11/2015 | Kim | H05K 3/34 |
| | | | 228/41 |
| 2020/0105553 A1 | 4/2020 | Kim | |
| 2020/0108459 A1* | 4/2020 | Lee | H05K 3/4007 |
| 2022/0152718 A1 | 5/2022 | Lee | |
| 2024/0207961 A1* | 6/2024 | Kim | B23K 1/0016 |

FOREIGN PATENT DOCUMENTS

| | | | | |
|---|---|---|---|---|
| CN | 109392254 A | * | 2/2019 | H05K 3/34 |
| CN | 110268459 A | * | 9/2019 | G09F 9/00 |
| CN | 116252087 A | * | 6/2023 | |
| KR | 1020060030923 A | | 4/2006 | |
| KR | 100854438 B1 | | 8/2008 | |
| KR | 20120036091 A | * | 4/2012 | |
| KR | 101364043 B1 | | 2/2014 | |
| KR | 101653573 B1 | | 9/2016 | |
| KR | 1020200036150 A | | 4/2020 | |
| KR | 1020200039383 A | | 4/2020 | |
| KR | 102330427 B1 | * | 11/2021 | |
| WO | WO-0214010 A1 | * | 2/2002 | B23K 3/0623 |
| WO | WO-2012159241 A1 | * | 11/2012 | B23K 1/0016 |
| WO | WO-2020004511 A1 | * | 1/2020 | B22F 1/05 |
| WO | WO-2021131897 A1 | * | 7/2021 | |

\* cited by examiner

'A'

BALL ATTACHMENT APPARATUS

CROSS-REFERENCE TO RELATED APPLICATIONS

This application claims benefit of priority under 35 U.S.C. § 119 to Korean Patent Application Nos. 10-2022-0181861 filed on Dec. 22, 2022 and 10-2023-0048047 filed on Apr. 12, 2023, in the Korean Intellectual Property Office, the disclosures of which are incorporated herein by reference in their entireties.

BACKGROUND

The present inventive concept relates to a ball attachment apparatus for attaching solder balls to a substrate strip.

In order to attach a plurality of solder balls to a substrate, a ball attachment apparatus adsorbing and attaching a plurality of solder balls to substrate units of a substrate strip at the same time has been used. The substrate strip may be deformed and ball pads may be shifted due to thermal stress applied during other manufacturing processes, for example, a chip mounting process and a chip molding process, performed before a solder ball attachment process.

SUMMARY

An aspect of the present inventive concept provides a ball attachment apparatus having improved alignment of solder balls and ball pads and improved productivity.

In accordance with an aspect of the disclosure, a ball attachment apparatus includes a tool case having a bottom surface on which solder balls are adsorbed, the solder balls being for attachment to a substrate strip including a plurality of substrate units: a plurality of holding tools in the tool case spaced apart from each other in a first direction, each of the plurality of holding tools including a plurality of holding regions and each of the plurality of holding regions including adsorption holes, the plurality of holding regions respectively corresponding to the plurality of substrate units and the adsorption holes arranged to respectively correspond to ball pads of the plurality of substrate units; and a plurality of insertion blocks respectively disposed between adjacent ones of the plurality of holding tools, wherein, among gaps between adjacent ones of the plurality of holding tools, a first gap at a first distance from a center of the tool case is different from at least one second gap at a second distance greater than the first distance from the center of the tool case.

In accordance with an aspect of the disclosure, a ball attachment apparatus includes a tool case; a plurality of holding tools in the tool case spaced apart from each other, each of the plurality of holding tools including adsorption holes to which solder balls are adsorbed; and a plurality of insertion blocks respectively disposed between the plurality of holding tools, wherein at least some of the plurality of insertion blocks have different widths from each other in an arrangement direction of the plurality of holding tools.

In accordance with an aspect of the disclosure, a ball attachment apparatus includes a tool case; a plurality of holding tools in the tool case spaced apart from each other, the plurality of holding tools being configured to adsorb solder balls; and a plurality of insertion blocks respectively disposed between adjacent ones of the plurality of holding tools, wherein a gap between adjacent ones of the plurality of holding tools is different from at least one other gap farther from the center of the tool case than the gap in an arrangement direction of the plurality of holding tools.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described with reference to the accompanying drawings. In this specification, terms, such as 'upper portion', 'upper surface, 'lower portion', 'lower surface', and 'side surface' are based on the drawings and may vary depending on the direction in which components are arranged, unless otherwise specified.

Figure 1:
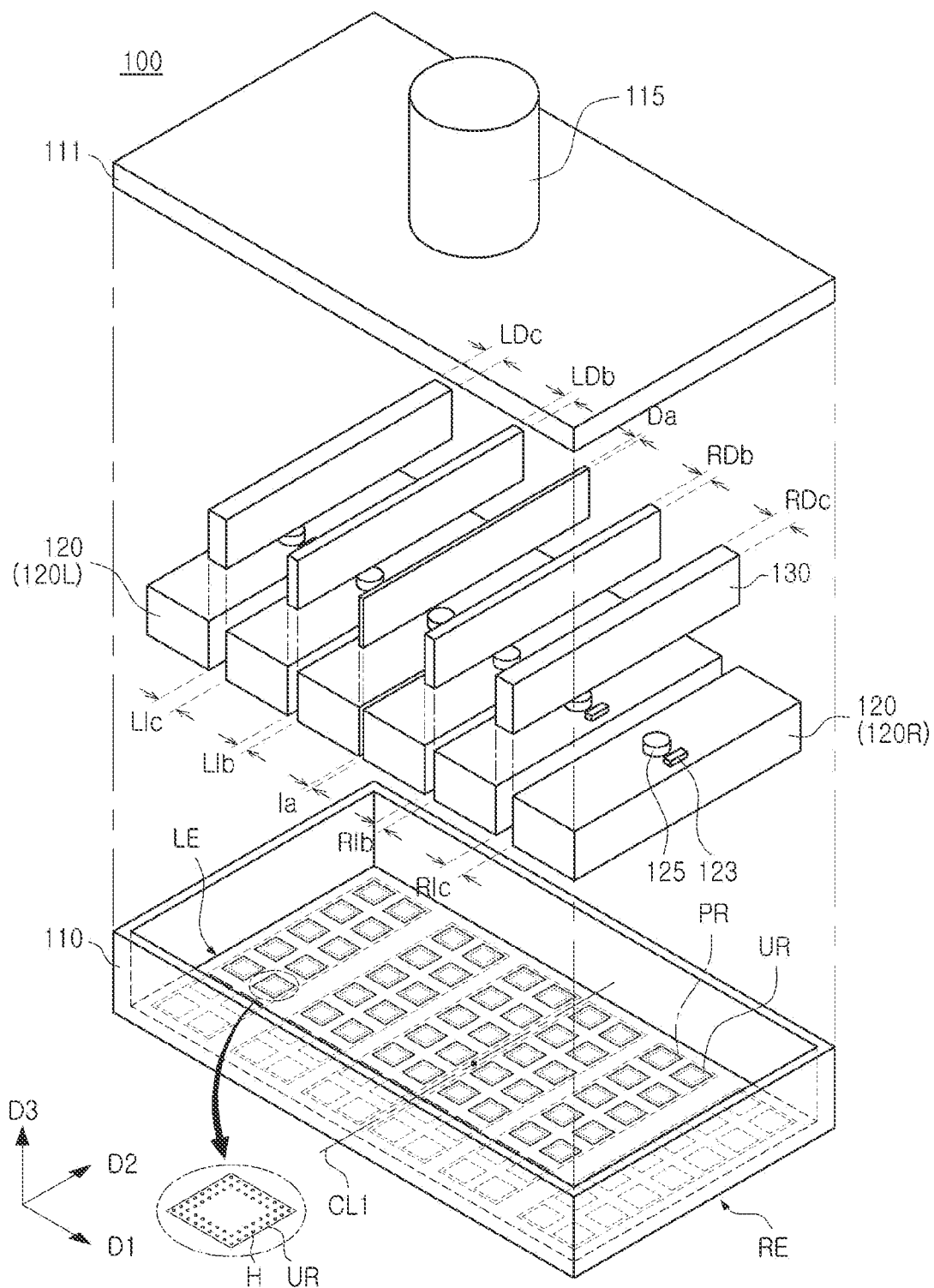
FIG. 1 is an exploded perspective view illustrating a ball attachment apparatus according to an embodiment of the present inventive concept.

FIG. 1 is an exploded perspective view illustrating a ball attachment apparatus 100 according to an embodiment of the present inventive concept.

Figure 2A:
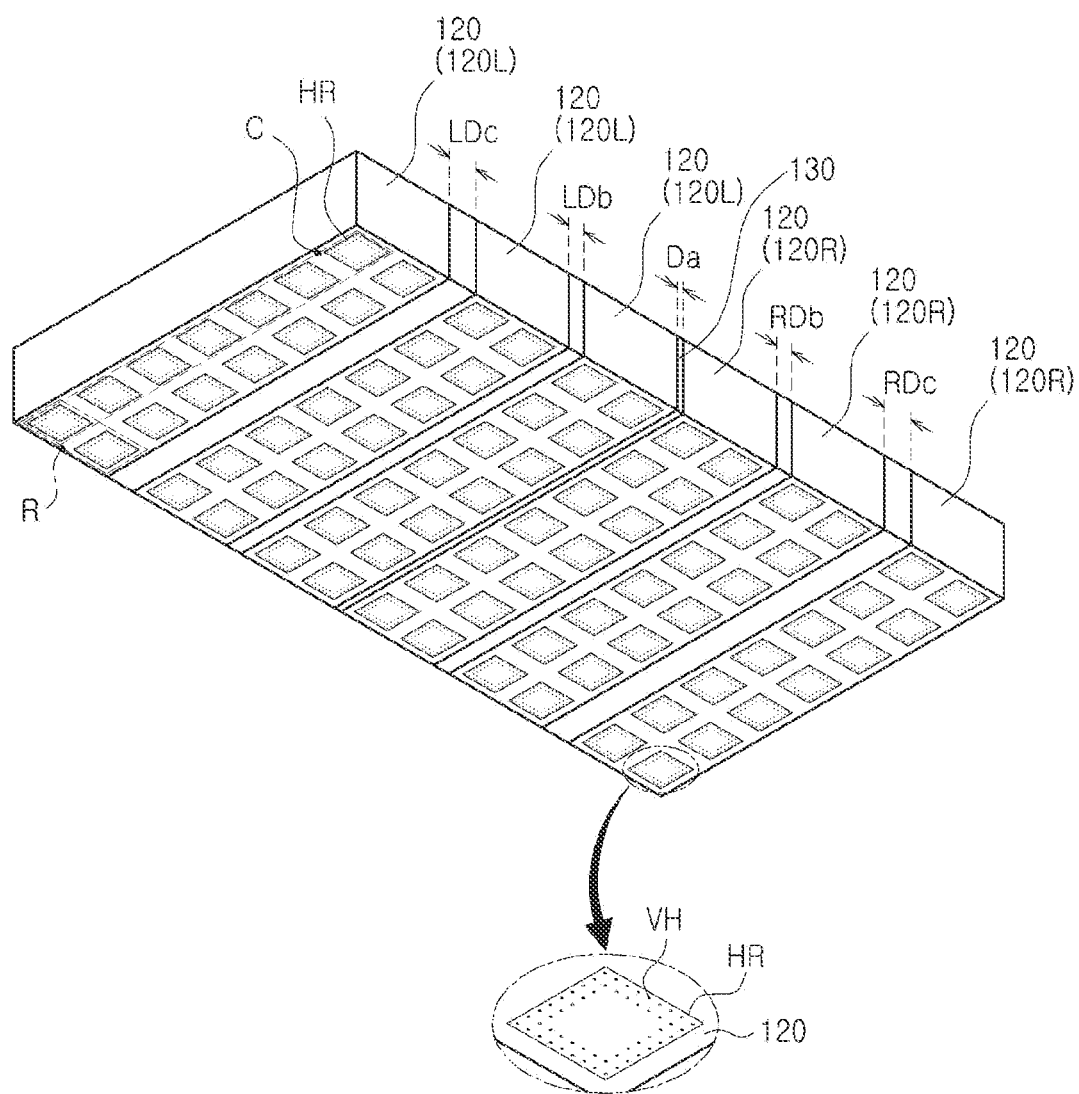
FIG. 2A is a bottom perspective view of a plurality of holding tools provided for an expanded substrate strip.
Figure 2B:
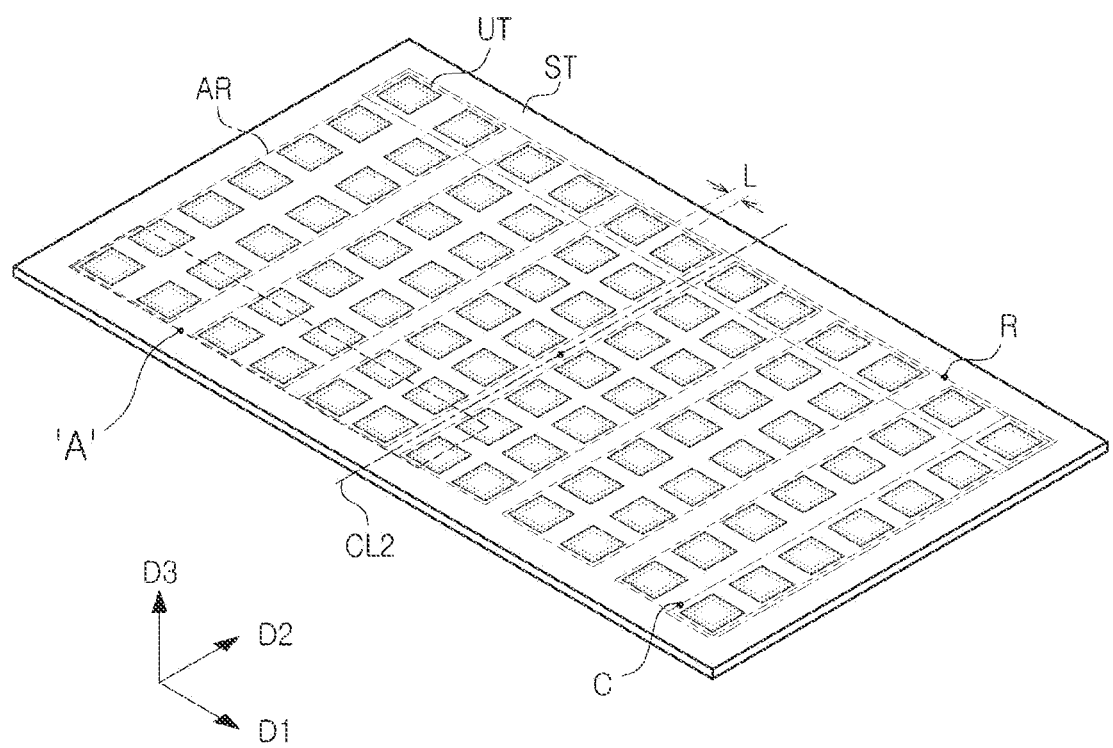
FIG. 2B is a perspective view illustrating an expanded substrate strip.
Figure 2C:
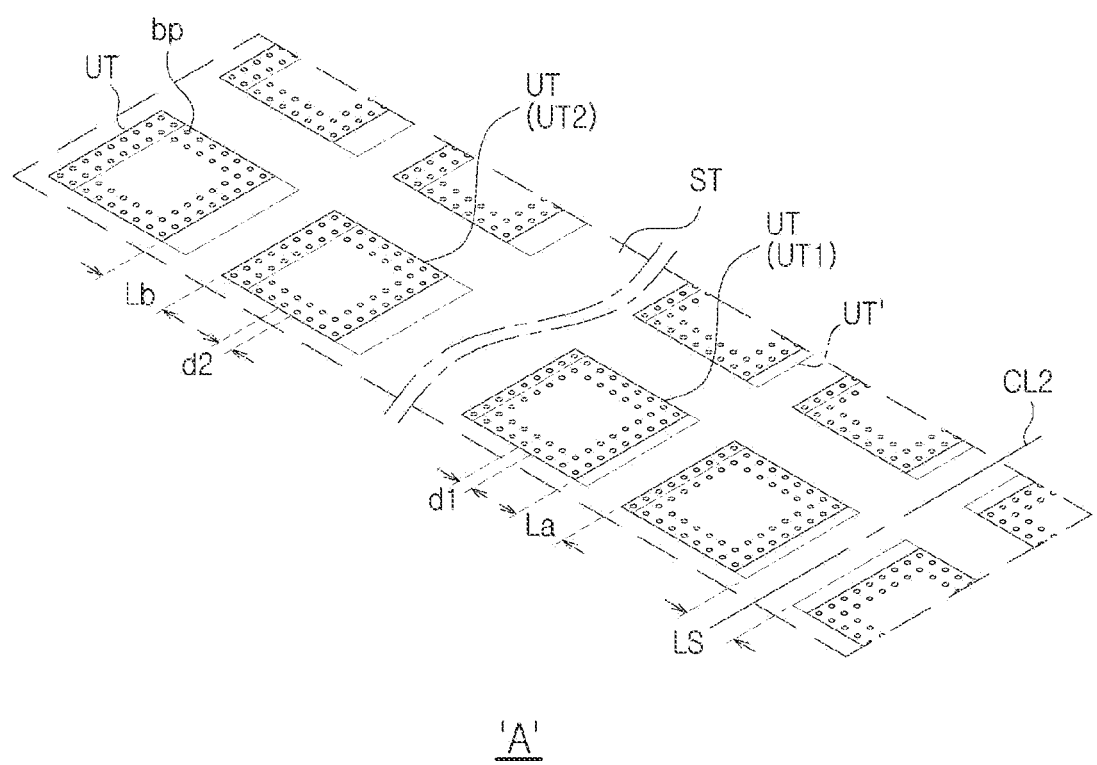
FIG. 2C is a partially enlarged view of region 'A' of FIG. 2B.

FIG. 2A is a bottom perspective view of a plurality of holding tools 120 provided for an expanded substrate strip ST, FIG. 2B is a perspective view illustrating an expanded substrate strip ST, and FIG. 2C is a partially enlarged view illustrating region 'A' of FIG. 2B.

Figure 3A:
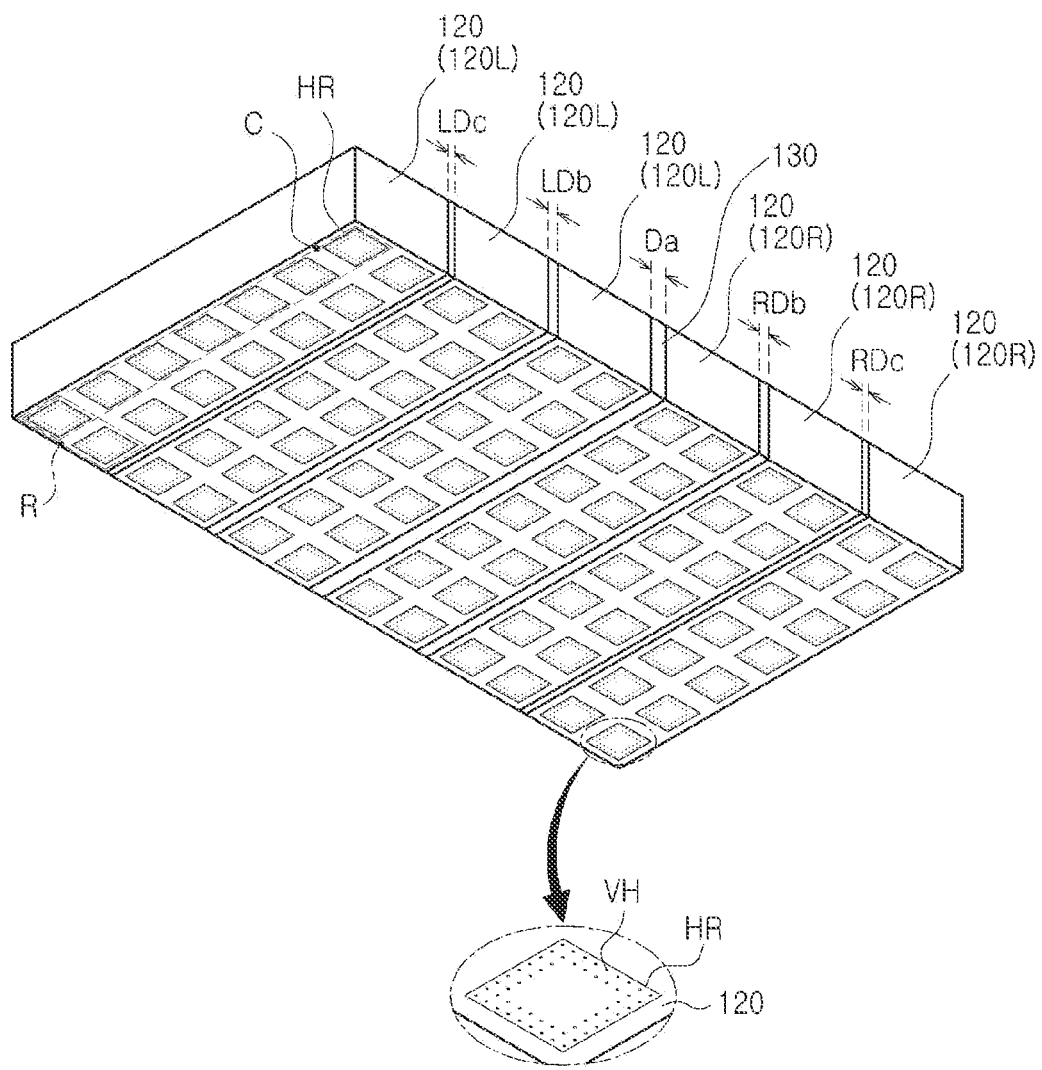
FIG. 3A is a bottom perspective view of a plurality of holding tools provided for a contracted substrate strip.
Figure 3B:
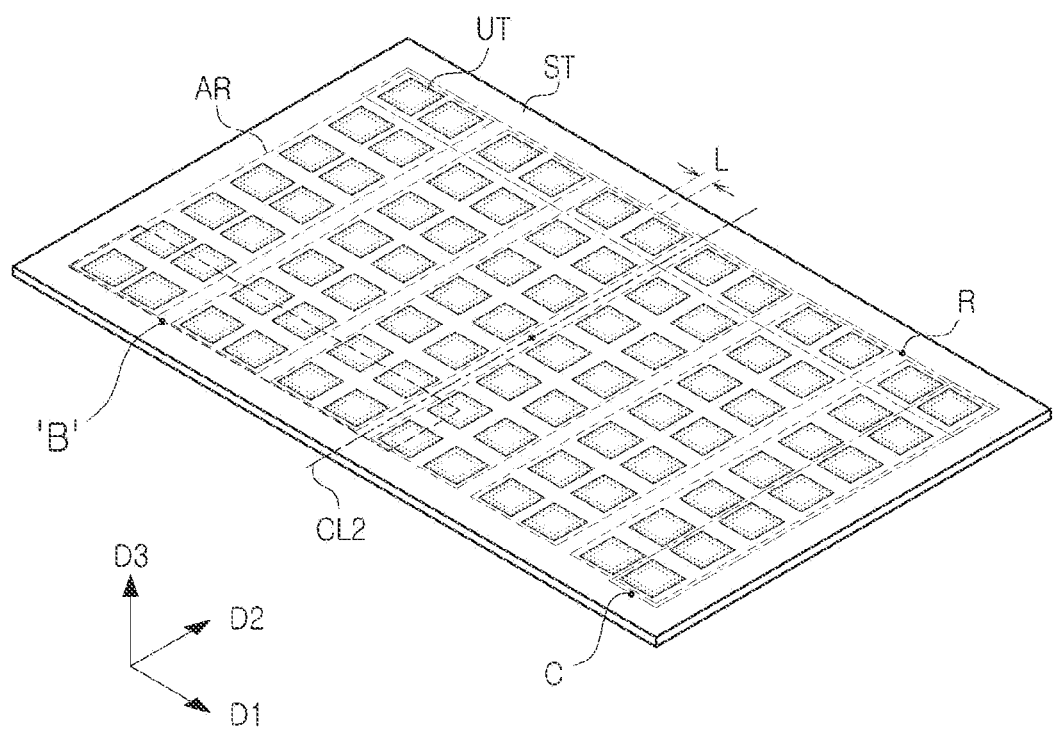
FIG. 3B is a perspective view of a contracted substrate strip.
Figure 3C:
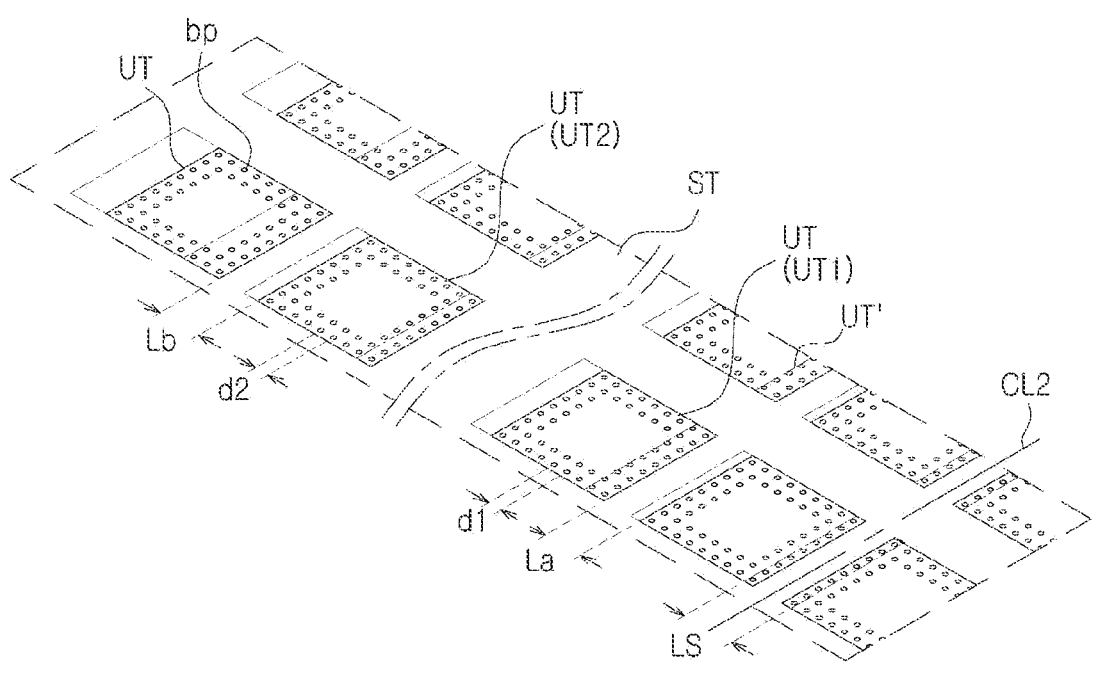
FIG. 3C is a partially enlarged view of region 'B' of FIG. 3B.

FIG. 3A is a perspective view of the plurality of holding tools 120 provided for a contracted substrate strip ST, FIG. 3B is a perspective view of the contracted substrate strip ST, and FIG. 3C is a partially enlarged view illustrating region 'B' of FIG. 3B.

Referring to FIGS. 1, 2A to 2C, and 3A to 3C, the ball attachment apparatus 100 according to embodiments of the present inventive concept may be configured to perform a solder ball attachment process to attach solder balls to ball pads bp of a substrate strip ST. The substrate strip ST may be a printed circuit board (PCB) strip in which a plurality of PCBs are integrally connected. According to embodiments, the substrate strip ST may be a semiconductor wafer including a plurality of unit dies. The solder ball attachment process may be performed on a substrate strip on which a "chip mounting process" and a "molding process" have been performed. Thermal stress that occurs during the "chip mounting process" and the "molding process" may cause deformation of the substrate strip ST and shift of the ball pads bp.

According to embodiments of the present inventive concept, the ball attachment apparatus 100 may include a plurality of holding tools 120 arranged at different intervals Ia, LIb, LIc, RIb, and RIc according to the degree of deformation of the substrate strip ST, thereby improving alignment of the shifted ball pads bp and the solder balls. In addition, the ball attachment apparatus 100 may perform the solder ball attachment process once to attach solder balls to the entire substrate strip deformed by thermal stress to thereby improve unit per equipment hour (UPEH).

The substrate strip ST may include a plurality of substrate units UT arranged to be adjacent to each other vertically and horizontally. The plurality of substrate units UT may be regions separated from each other by a sawing process to form a single semiconductor package. The plurality of substrate units UT may be arranged in a plurality of rows R extending in a first direction D1 and a plurality of columns C extending in a second direction D2, perpendicular to the first direction D1. As shown in FIGS. 2C and 3C, the plurality of substrate units UT of the substrate strip ST provided in the solder ball attachment process may be in a state shifted from a reference position UT'. Here, the reference position UT' refers to an initial position of the plurality of substrate units UT before the "chip mounting process" and the "molding process" are performed.

The deformation of the substrate strip ST may tend to lengthen or shorten in a length direction (e.g., the 'first direction' D1). For example, as shown in FIGS. 2A and 2B, the substrate strip ST may be expanded in the length direction (e.g., the 'first direction' D1) with respect to the center (or a 'center line') CL2 as a whole. In addition, as shown in FIGS. 3B and 3C, the substrate strip ST may be contracted in the length direction (e.g., the 'first direction' D1) with respect to the center (or the 'center line') CL2 as a whole.

In the substrate strip ST, deformation may be accumulated in a direction toward the edge in the length direction (e.g., the 'first direction' D1) from the center CL2. Accordingly, a separation distance L between adjacent ones of the plurality of substrate units UT may increase or decrease in a direction away from the center CL2 of the substrate strip ST.

As shown in FIGS. 2B and 2C, a first separation distance La adjacent to the center CL2 of the substrate strip ST may be smaller than a second separation distance Lb located farther from the center CL2 of the substrate strip ST. The first separation distance La and the second separation distance Lb may be greater than a reference distance LS. Here, the reference distance LS refers to a separation distance between the reference positions UT' closest to the center CL2 of the substrate strip ST. In addition, distances between adjacent ball pads bp arranged in the plurality of substrate units UT may also be different. For example, a distance d1 between adjacent ball pads bp in a first substrate unit UT1 adjacent to the center CL2 of the substrate strip ST may be smaller than a distance d2 between adjacent ball pads bp in a second substrate unit UT2 located farther from the center CL2 of the substrate strip ST.

As shown in FIGS. 3B and 3C, the first separation distance La adjacent to the center CL2 of the substrate strip ST may be greater than the second separation distance Lb located farther from the center CL2 of the substrate strip ST. The first separation distance La and the second separation distance Lb may be smaller than the reference distance LS. Here, the reference distance LS refers to a separation distance between the reference positions UT' closest to the center CL2 of the substrate strip ST. In addition, the distance d1 between adjacent ball pads bp in the first substrate unit UT1 adjacent to the center CL2 of the substrate strip ST may be greater than the distance d2 between adjacent ball pads bp in the second substrate unit UT2 located farther from the center CL2 of the substrate strip ST.

However, the shape of the substrate strip ST described above only represents the main tendency of deformation due to thermal stress, and does not mean that the deformation of the substrate strip ST occurs only in the length direction (e.g., in the "first direction" D1) or that the degree of deformation of the substrate strip ST increases in proportion to the distance with respect to the center CL2. For example, when the substrate strip ST is deformed to the extent that solder balls are misaligned in both the first direction D1 and the second direction D2, the plurality of holding tools 120 may be respectively further configured as second direction holding units arranged in the second direction D2 and intervals between the second direction holding units may be adjusted based on a center line extending in the first direction of the substrate strip ST.

In the present inventive concept, the plurality of substrate units UT in the substrate strip ST deformed by thermal stress may be grouped to a plurality of work regions AR arranged in the length direction (the 'first direction' D1) of the substrate strip ST and the plurality of holding tools 120 of the ball attachment apparatus 100 may be arranged to correspond to the plurality of word regions AR, thereby minimizing misalignment of the plurality of substrate units UT and a plurality of holding regions HR. The substrate strip ST may include a plurality of substrate units UT and a plurality of work regions AR, which are larger in number than shown in the drawings.

As shown in FIGS. 1, 2A, and 3A, any one (e.g., Ia) of the intervals Ia, LIb, LIc, RIb, and RIc between the plurality of holding tools 120 may be less or greater than at least one of the intervals LIb, LIc, RIb, and RIc farther from the center CL1 of the tool case 110 than the any one interval (e.g., Ia) in the 'first direction' D1. Here, a case in which any one (e.g., Ia) of the intervals is small means that the intervals Ia, LIb, LIc, RIb, and RIc between the plurality of holding tools 120 have been adjusted to correspond to the substrate strip ST expanded in the length direction. In addition, a case in which any one (e.g., Ia) of the intervals is large means that the intervals Ia, LIb, LIc, RIb, and RIc between the plurality of holding tools 120 have been adjusted correspond to the substrate strip ST contracted in the length direction. For example, among the intervals Ia, LIb, LIc, RIb, and RIc between the plurality of holding tools 120, a first interval (e.g., LIb, or RIb) at a first distance from the center CL1 of the tool case 110 may be smaller or greater than at least one second interval (e.g., LIb, LIc, RIb, or RIc) at a second distance from the center CL1 greater than the first distance. The intervals Ia, LIb, LIc, RIb, and RIc between the plurality of holding tools 120 may range, for example, from about 5 µm to about 500 µm, from about 5 µm to about 400 µm, or from about 5 µm to about 300 µm, but is not limited thereto.

The intervals Ia, LIb, LIc, RIb, and RIc between the plurality of holding tools 120 may be determined according to the degree of deformation of the substrate strip ST. In addition, the intervals Ia, LIb, LIc, RIb, and RIc between the plurality of holding tools 120 may be determined according to a size of the substrate strip ST. For example, when the length of the substrate strip ST increases by 10 times, the intervals Ia, LIb, LIc, RIb, and RIc between the plurality of holding tools 120 may be determined in the range of about 1 μm to about 5 mm.

Correspondingly, at least some of a plurality of insertion blocks 130 may have different widths Da, LDb, LDc, RDb, and RDc in the length direction (e.g., the 'first direction' D1) of the tool case 110. For example, the plurality of insertion blocks 130 may include a first insertion block disposed within the first interval (e.g., Ia, LIb, or RIb) and a second insertion block disposed within the second interval (e.g., LIb, LIc, RIb, or RIc), and a width (e.g., Da, LDb, or RDb) of the first insertion block may be smaller or greater than a width (e.g., LDb, LDc, RDb, or RDc) of the second insertion block (refer to FIGS. 2A and 3A).

The ball attachment apparatus 100 of an embodiment may include a tool case 110, a plurality of holding tools 120, and a plurality of insertion blocks 130. The ball attachment apparatus 100 may include a plurality of holding tools 120 and a plurality of insertion blocks 130 greater than those shown in the drawings.

The tool case 110 may have an elongated shape in the length direction (e.g., the "first direction" D1) of the substrate strip ST. The shape of the tool case 110 may be variously modified according to the shape of the substrate strip ST. For example, when the substrate strip ST is square, the tool case 110 may have the same length in the first direction D1 as in the second direction D2. The tool case 110 may provide a space in which the plurality of holding tools 120 and the plurality of insertion blocks 130 are accommodated. The tool case 110 may have a bottom surface on which solder balls to be attached to the substrate strip ST are adsorbed. The tool case 110 may include a plurality of tool arrangement regions PR in which the plurality of holding tools 120 are mounted, a plurality of unit regions UR arranged in the plurality of tool arrangement regions PR, and a plurality of accommodating holes H arranged in the plurality of unit regions UR.

The plurality of tool arrangement regions PR may be aligned with the plurality of holding tools 120 in a vertical direction D3. The plurality of unit regions UR may be aligned with the plurality of holding regions HR of the plurality of holding tools 120 in the vertical direction D3. The accommodating holes H may be aligned with the adsorption holes VH of the plurality of holding tools 120 in the vertical direction D3. The accommodating holes H may pass through the bottom surface of the tool case 110 and have a diameter larger than that of the adsorption holes VH.

The intervals between the plurality of tool arrangement regions PR may correspond to the intervals Ia, LIb, LIc, RIb, and RIc between the plurality of holding tools 120. For example, one of the intervals between the plurality of tool arrangement regions PR may be smaller or greater than at least one of intervals farther from the center (or the 'central line') CL1 of the tool case 110 in the first direction D1. For example, the intervals between the plurality of tool arrangement regions PR may increase or decrease in a direction toward a left edge LE and a right edge RE of the tool case 110. The intervals between the plurality of tool arrangement regions PR and the intervals Ia, LIb, LIc, RIb, and RIc between the plurality of holding tools 120 may be determined in consideration of deformation (expansion or contraction) of the substrate strip ST.

A cover 111 covering an internal space of the tool case 110 and a driving unit 115 lifting and lowering the tool case 110 up and down may be disposed in an upper portion of the tool case 110. The cover 111 may be coupled to the tool case 110 to cover the plurality of holding tools 120 and the plurality of insertion blocks 130. The driver 115 may include a cylinder disposed on an upper surface of the cover 111 and configured to lift or lower the tool case 110 in the direction D3, perpendicular to the upper surface of the substrate strip ST. During the solder ball attachment process, the center CL1 of the tool case 110 may be aligned with the center CL2 of the substrate strip ST.

The plurality of holding tools 120 may be disposed to correspond to the plurality of tool arrangement regions PR of the tool case 110. The plurality of holding tools 120 may be arranged in the tool case 110 to be spaced apart from each other in the first direction D1. The plurality of holding tools 120 may be respectively arranged in the plurality of tool arrangement regions PR of the tool case 110.

The plurality of holding tools 120 may be configured to adsorb solder balls attached to the substrate strip ST. The plurality of holding tools 120 may include a plurality of holding regions HR and adsorption holes VH. The plurality of holding regions HR may respectively correspond to the plurality of unit regions UR of the tool case 110 and the plurality of substrate units UT of the substrate strip ST. The adsorption holes VH may be arranged to correspond to the accommodating holes H of the tool case 110 and the ball pads bp of the substrate strip ST in the plurality of holding regions HT.

The plurality of holding tools 120 may be divided and disposed in the length direction (e.g., 'first direction' D1) in which processing tolerances of the substrate strip ST are accumulated. That is, by appropriately setting the interval between the plurality of holding tools 120 in the length direction (e.g., the 'first direction' D1), alignment of the solder balls adsorbed to the plurality of holding tools 120 and the ball pads bp of the substrate strip ST may be effectively improved. According to an embodiment, the plurality of holding tools 120 may include a plurality of holding units divided and arranged in a width direction (e.g., the 'second direction'), perpendicular to the length direction (e.g., the 'first direction' D1). Intervals between the plurality of holding units in the width direction (e.g., the 'second direction') may be adjusted in a manner similar to that of the intervals between the plurality of holding tools 120 in the length direction (e.g., the 'first direction' D1), which will be described later.

The intervals Ia, Lib, Lic, Rib, and Ric between the plurality of holding tools 120 may increase or decrease in a direction toward to the edge of the tool case 110 in the first direction D1. For example, among the intervals Ia, Lib, Lic, Rib, and Ric between the plurality of holding tools 120, the first interval (e.g., Ia, Lib, or Rib) may be smaller or greater than at least one second interval (e.g., Lib, Lic, Rib, or Ric) that is relatively farther from the center CL1 than the first interval (e.g., Ia, Lib, or Rib).

The plurality of holding tools 120 may be arranged between a left edge LE and a right edge RE of the tool case 110 spaced apart in the first direction D1. The plurality of holding tools 120 may include left holding tools 120L arranged between the center CL1 and the left edge LE of the tool case 110 and right holding tools 120R arranged between the center CL1 of the tool case 110 and the right edge RE. According to an embodiment, the left holding tools 120L and the right holding tools 120R may be symmetrically arranged with respect to the center CL1 of the tool case 110. For example, the number of left holding tools 120L may be the same as the number of right holding tools 120R. Also, the number of intervals Lib and Lic of the left holding tools 120L may be the same as the number of intervals Rib and Ric of the right holding tools 120R. According to an embodiment, the intervals Lib and Lic of the left holding tools 120L and the intervals Rib and Ric of the right holding tools 120R may have different sizes (see, e.g., FIG. 6).

In an embodiment, the plurality of holding tools 120 may have an elongated shape in the second direction D2, different from (e.g., perpendicular to) the length direction (e.g., the 'first direction' D1) of the substrate strip ST. The plurality of holding regions HR respectively included in the plurality of holding tools 120 may be arranged in a plurality of rows R extending in the first direction D1 and at least one column C extending in the second direction D2, and the number of the plurality of rows R may be greater than the number of the at least one column C in each of the plurality of holding tools 120. The plurality of holding tools 120 may have the same width in the first direction D1, but are not limited thereto. According to an embodiment, at least some of the plurality of holding tools 120 may have different widths.

In addition, each of the plurality of holding tools 120 may further include a pressure adjusting portion 123 configured to adjust internal pressure of each of the plurality of holding tools 120 to allow solder balls to be adsorbed. The pressure adjusting portion 123 may include a vacuum pump applying vacuum pressure to the adsorption holes VH of the plurality of holding tools 120.

In addition, the plurality of holding tools 120 may further include pressing pins (refer to '124' in FIG. 4) pushing the solder balls adsorbed into the adsorption holes VH and a lifting driving portion 125 configured to raise and lower the pressing pins.

The plurality of insertion blocks 130 may be respectively arranged between the plurality of holding tools 120. The plurality of insertion blocks 130 may have widths Da, LDb, LDc, RDb, and RDc corresponding to the intervals Ia, Lib, Lic, Rib, and Ric between the plurality of holding tools 120. For example, any one block closest to the center CL1 of the tool case 110, among the plurality of insertion blocks 130, may have a width (e.g., Da) smaller or greater than a width (e.g., LDb, LDc, RDb, or RDc) of at least one block closer to the edges LE and RE of the tool case 110 than to the center CL1 of the tool case 110 in the first direction D1 (refer to FIGS. 2A and 3A). One of the plurality of insertion blocks 130 may be vertically aligned with the center CL1 of the tool case 110, but is not limited thereto.

Referring to FIGS. 2A and 3A, it is illustrated that the widths LDb, LDc, RDb, and RDc of the plurality of insertion blocks 130 increase or decrease in proportion to the distance from the central block 130 overlapping the center CL1 of the tool case 110, but are not limited thereto. The widths LDb and LDc of the left insertion blocks 130 disposed between the left holding tools 120L and the widths RDb and RDc of the right insertion blocks 130 disposed between the right holding tools 120R may be different from each other (see, e.g., FIG. 6).

Hereinafter, ball attachment apparatuses according to embodiments of the present inventive concept will be described with reference to FIGS. 4 to 8. FIGS. 4 to 8 illustrate vertical cross-sections of the ball attachment apparatus in an assembled state. FIGS. 4 to 8 illustrate only four holding tools 120 in order to clearly illustrate a cross-section of the holding tool 120. FIGS. 4 to 8 illustrate ball attachment apparatuses 100A, 100B, 100C, 100D, and 100E in which a plurality of holding tools 120 are arranged to correspond to an expanded substrate strip ST, but embodiments of the present inventive concept are not limited thereto.

Figure 4:
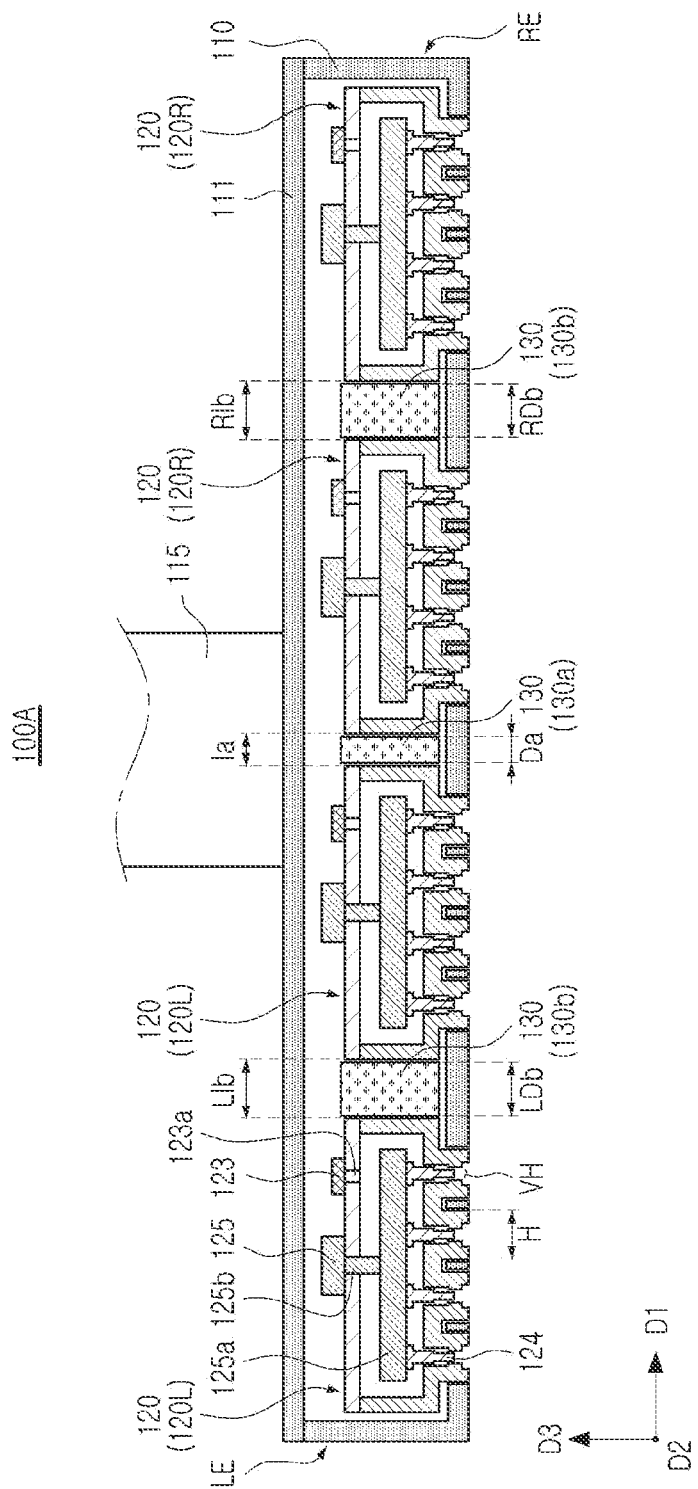
FIG. 4 is a cross-sectional view illustrating a ball attachment apparatus according to an embodiment of the present inventive concept.

FIG. 4 is a cross-sectional view illustrating the ball attachment apparatus 100A according to an embodiment of the present inventive concept.

Referring to FIG. 4, the ball attachment apparatus 100A of an embodiment may include a plurality of holding tools 120 and a plurality of insertion blocks 130 arranged in the first direction D1 within the tool case 110.

The tool case 110 may provide a space in which the plurality of holding tools 120 and the plurality of insertion blocks 130 are accommodated. The tool case 110 may include accommodating holes H penetrating through a bottom surface. Adsorption holes VH in which solder balls are vacuum-sucked may be aligned with the accommodating holes H. Intervals Ia, LIb, and RIb between the plurality of holding tools 120 may be adjusted variously according to the degree of deformation of the substrate strip, and the tool case 110 may select any one of tool cases 110 in consideration of an arrangement interval of the plurality of holding tools 120.

The plurality of holding tools 120 may be spaced apart from each other to secure an alignment margin between the shifted ball pads and the solder ball. Among the intervals Ia, LIb, and RIb between the plurality of holding tools 120, the interval Ia located in the center between the left edge LE and the right edge RE of the tool case 110 may be smaller than the intervals Lib and Rib closer to the left edge LE of the tool case 110 and the right edge RE of the tool case 110, respectively.

The plurality of insertion blocks 130 may be respectively disposed at the intervals Ia, LIb, and RIb between the plurality of holding tools 120. The plurality of insertion blocks 130 may include a first insertion block 130a located in the center between the left edge LE and the right edge RE of the tool case 110 and second insertion blocks 130b closer to the left edge LE of the tool case 110 and the right edge RE of the tool case 110, respectively. A width Da of the first insertion block 130a may be smaller than the widths LDb and RDb of the second insertion blocks 130b. The plurality of insertion blocks 130 may include a material having rigidity capable of maintaining the intervals Ia, LIb, and RIb between the plurality of holding tools 120. For example, the plurality of insertion blocks 130 may include a metal such as stainless steel, but is not limited thereto.

Each of the plurality of holding tools 120 may include the pressure adjusting portion 123 configured to adjust internal pressure of the plurality of holding tools 120 to allow the solder balls to be adsorbed. The pressure adjusting portion 123 may apply vacuum pressure for adsorption of the solder balls to the adsorption holes VH through a vacuum flow path 123a communicating with the adsorption holes VH. For example, the pressure adjusting portion 123 may include a vacuum pump.

The plurality of holding tools 120 may include the pressing pins 124 respectively disposed in the adsorption holes VH and the lifting driving portion 125 configured to lift and lower the pressing pins 124. The pressing pins 124 may be configured to push the solder balls vacuum-adsorbed into the adsorption holes VH downwardly. For example, the pressing pins 124 may be divided into a head portion, a body portion, and a pushing portion corresponding to a step shape of the adsorption holes VH. The pressing pins 124 may be moved downwardly by the lifting driving portion 125 and then moved upwardly again by an elastic member. The lifting driving portion 125 may include a back plate 125a disposed on the pressing pins 124 and a driving shaft 125b lifting and lowering the back plate 125a.

Figure 5:
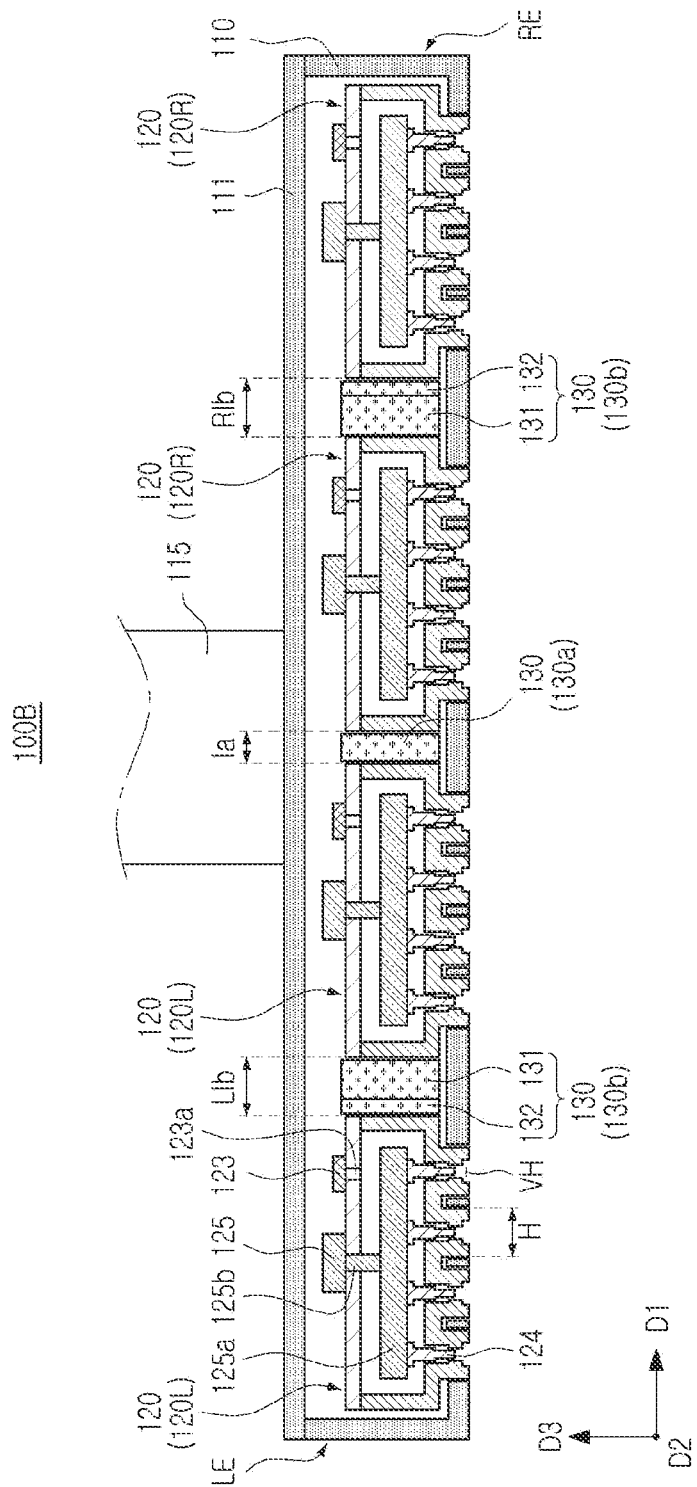
FIG. 5 is a cross-sectional view illustrating a ball attachment apparatus according to an embodiment of the present inventive concept.

FIG. 5 is a cross-sectional view illustrating a ball attachment apparatus 100B according to an embodiment of the present inventive concept.

Referring to FIG. 5, the ball attachment apparatus 100B of an embodiment may have characteristics the same as or similar to those described above with reference to FIGS. 1 to 4, except that at least some of the plurality of insertion blocks 130 include a plurality of block layers.

The plurality of insertion blocks 130 may include a first insertion block 130a located in the center between the left edge LE and the right edge RE of the tool case 110 and second insertion blocks 130b closer to the left edge LE of the tool case 110 and the right edge RE of the tool case 110, respectively. The second insertion blocks 130b may include a plurality of block layers 131 and 132 stacked in the first direction D1 and the second insertion blocks 130b may have a width greater than that of the first insertion block 130a. In addition, the plurality of block layers 131 and 132 may have different widths, but are not limited thereto. According to an embodiment, the plurality of block layers 131 and 132 may have the same width, and the first insertion block 130a may also include a plurality of block layers. In this manner, the widths of the plurality of insertion blocks 130 and the intervals Ia, Lib, and Rib between the plurality of holding tools 120 are more precisely adjusted using the plurality of block layers 131 and 132.

Figure 6:
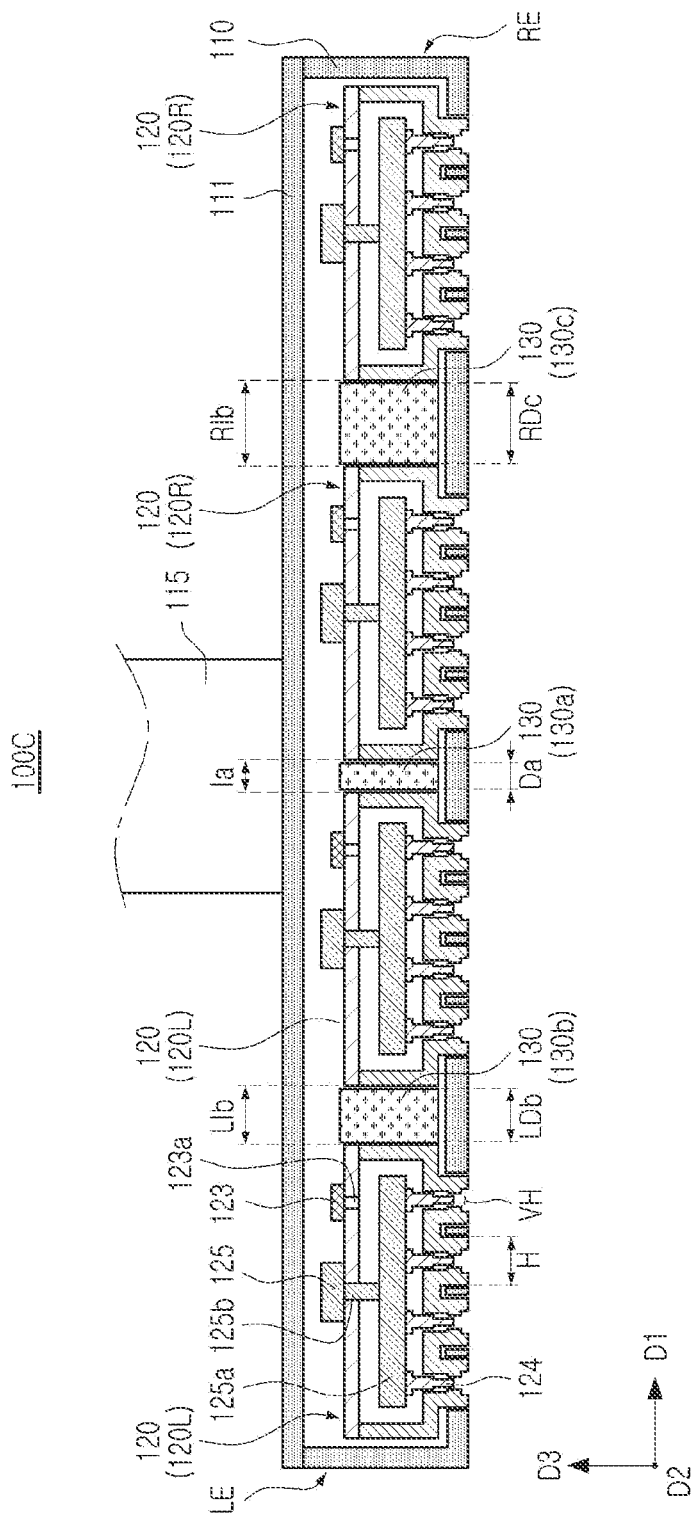
FIG. 6 is a cross-sectional view illustrating a ball attachment apparatus according to an embodiment of the present inventive concept.

FIG. 6 is a cross-sectional view illustrating a ball attachment apparatus 100C according to an embodiment of the present inventive concept.

Referring to FIG. 6, the ball attachment apparatus 100C of an embodiment may have characteristics the same as or similar to those described above with reference to FIGS. 1 to 5, except that the interval Lib between the left holding tools 120L may be different from the interval Rib between the right holding tools 120R arranged in positions symmetrical to each other based on the interval Ia located in the center of the tool case 110.

Among the intervals Ia, Lib, and Rib between the plurality of holding tools 120, the left interval Lib closest to the left edge LE of the tool case 110 and the right interval RIb closest to the right edge RE of the tool case 110 may be different from each other. For example, the left interval LIb may be smaller than the right interval RIb. Correspondingly, the plurality of insertion blocks 130 may include a second insertion block 130b disposed within the left interval LIb and a third insertion block 130c disposed within the right interval Rib, and a width LDb of the second insertion block 130b may be smaller than a width RDc of the third insertion block 130c. As such, the intervals Ia, LIb, and RIb between the plurality of holding tools 120 may be variously modified according to the degree of deformation of the substrate strip to which the solder balls are attached.

Figure 7:
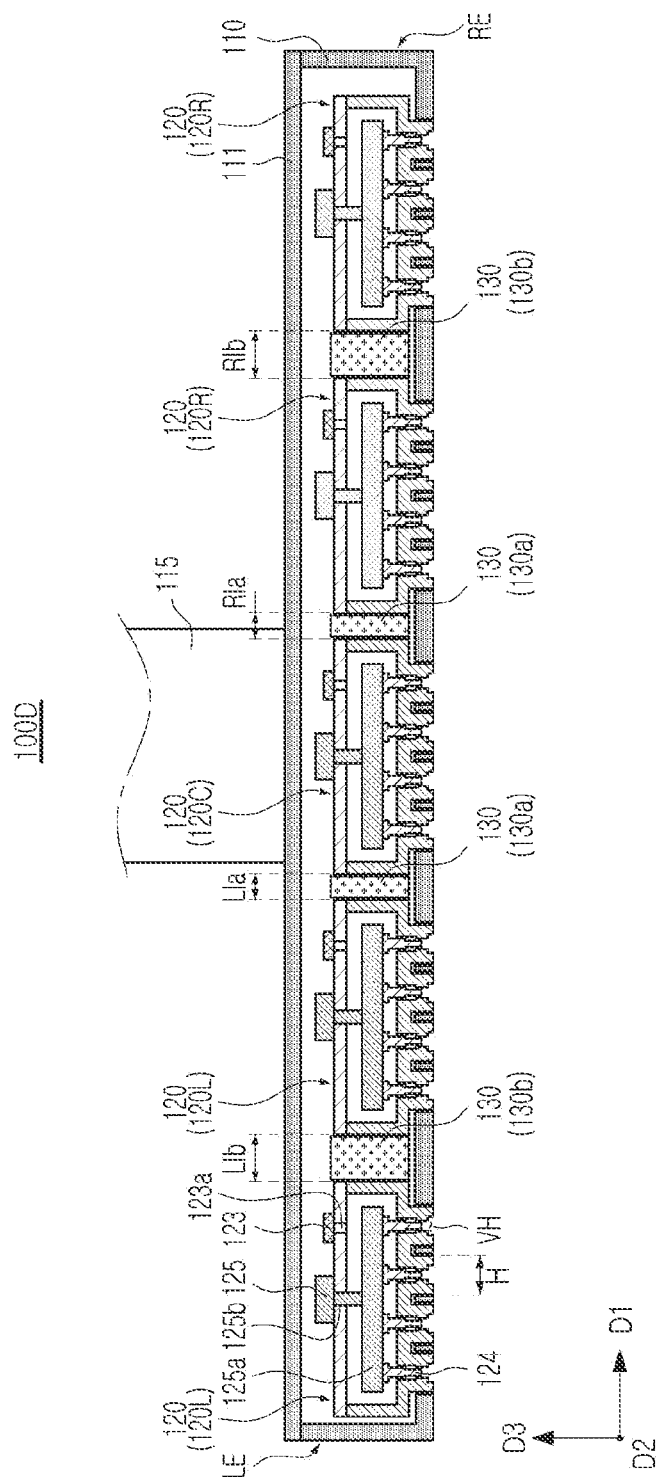
FIG. 7 is a cross-sectional view illustrating a ball attachment apparatus according to an embodiment of the present inventive concept.

FIG. 7 is a cross-sectional view illustrating a ball attachment apparatus 100D according to an embodiment of the present inventive concept.

Referring to FIG. 7, the ball attachment apparatus 100D of an embodiment may have characteristics the same as or similar to those described above with reference to FIGS. 1 to 6, except that the holding tool 120 is disposed in the center of the tool case 110 instead of the insertion block 130a.

The plurality of holding tools 120 may include a holding tool 120C disposed in the center between the left edge LE and the right edge RE of the tool case 110 and left holding tools 120L and right holding tools 120R arranged on respective sides thereof. The holding tool 120C disposed between the left holding tools 120L and the right holding tools 120R may vertically overlap the center of the tool case 110. Among the left intervals LIa and LIb of the plurality of holding tools 120, the first interval (e.g., LIa) adjacent to the center of the tool case 110 may be smaller than the second interval (e.g., Lib) adjacent to the left edge LE of the tool case 110. Among the right intervals RIa and RIb of the plurality of holding tools 120, the third interval (e.g., RIa) adjacent to the center of the tool case 110 may be smaller than the fourth interval (e.g., RIb) adjacent to the right edge RE of the tool case 110. According to embodiments, the first interval (e.g., Lia) and the third interval (e.g., Ria) may be different from each other, and the second interval (e.g., Lib) and the fourth interval (e.g., Rib) may be different from each other.

Figure 8:
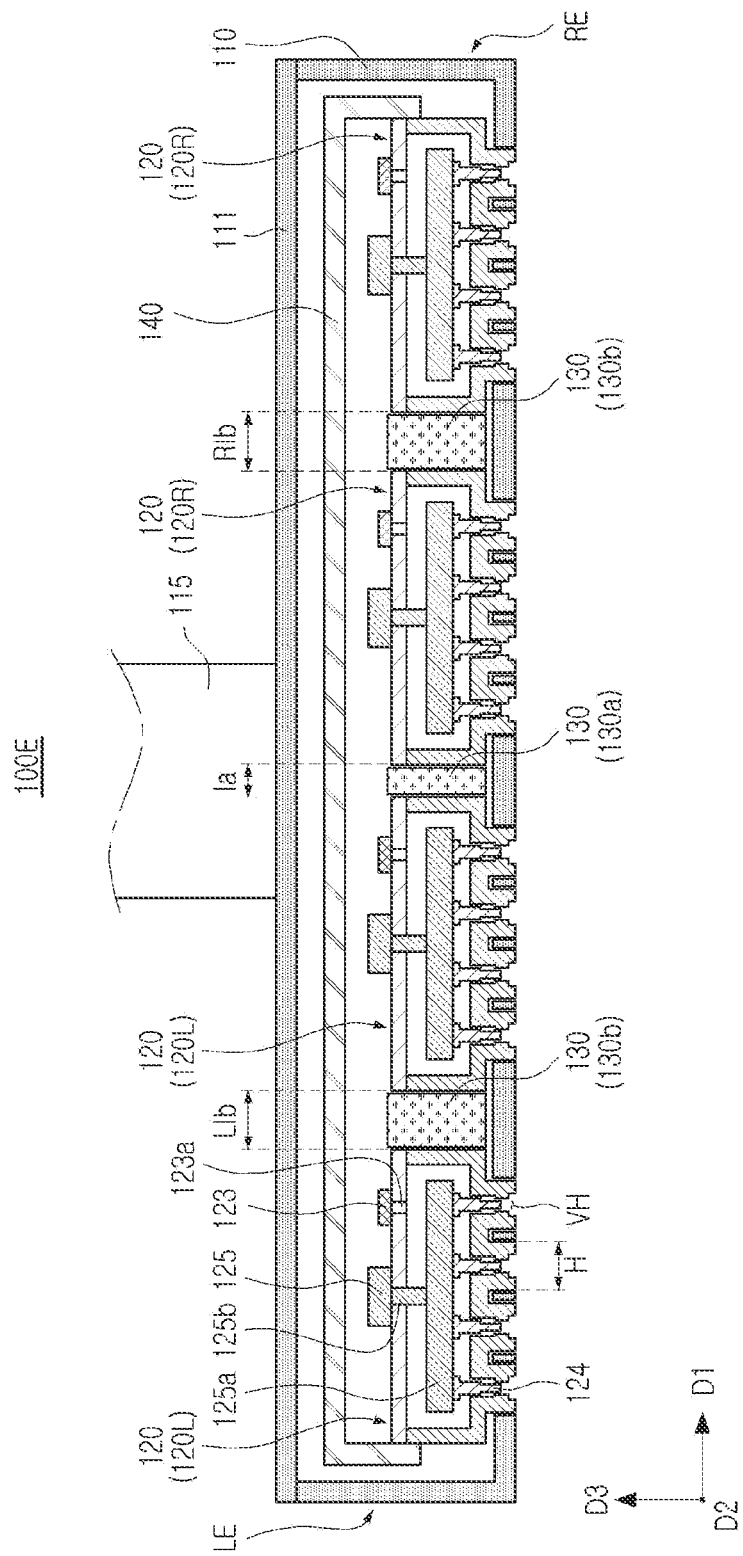
FIG. 8 is a cross-sectional view illustrating a ball attachment apparatus according to an embodiment of the present inventive concept.

FIG. 8 is a cross-sectional view illustrating a ball attachment apparatus 100E according to an embodiment of the present inventive concept.

Referring to FIG. 8, the ball attachment apparatus 100E of an embodiment may have characteristics the same as or similar to those described above with reference to FIGS. 1 to 7, except that a coupling member 140 supporting a plurality of holding tools 120 and a plurality of insertion blocks 130 is further provided.

The coupling member 140 may be configured to adhere and fix the plurality of holding tools 120 and the plurality of insertion blocks 130 alternately arranged in the first direction D1. The coupling member 140 may integrate the plurality of holding tools 120 arranged at various intervals and the plurality of insertion blocks 130 filling gaps therebetween. Therefore, it is possible to adjust the interval between the plurality of holding tools 120 and replace the tool case 110 more easily than to individually mount the plurality of holding tools 120 on the tool case 110 or individually separate the plurality of holding tools 120 from the tool case 110.

FIGS. 9A to 9D are diagrams illustrating a solder ball attachment process using the ball attachment apparatus 100A according to an embodiment of the present inventive concept.

Figure 9A:
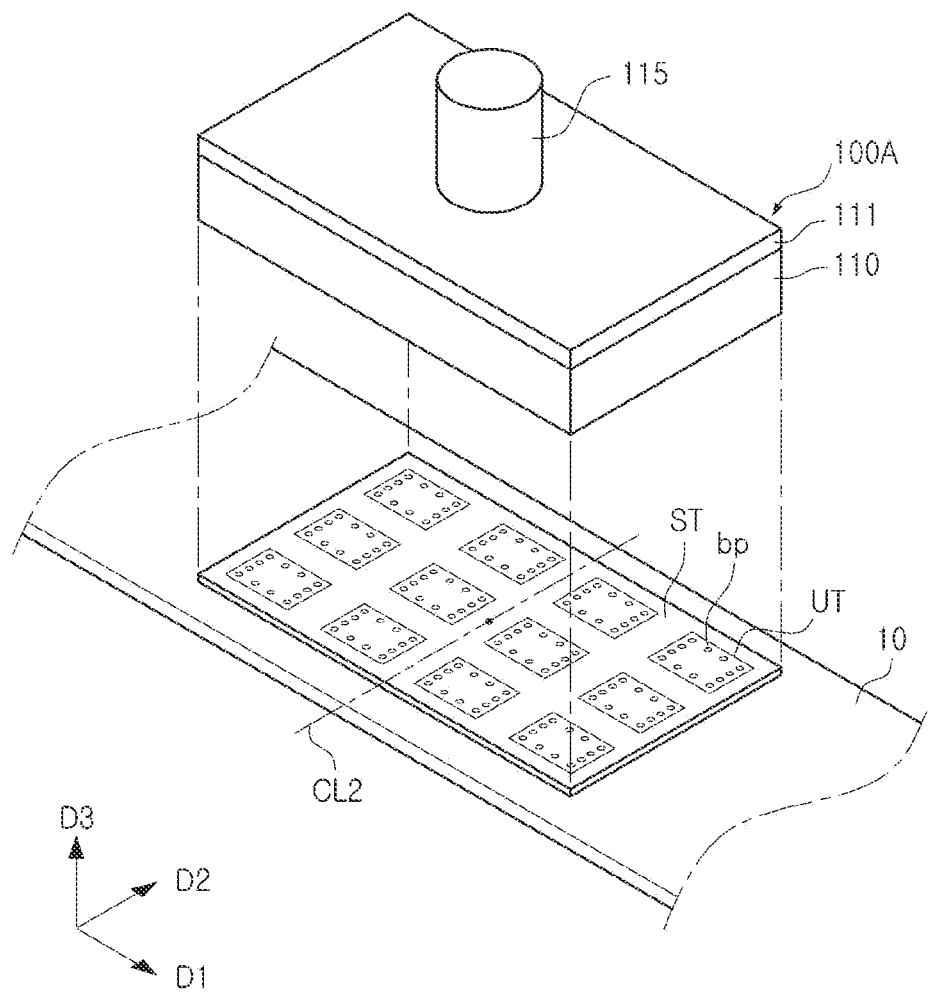
FIGS. 9A to 9D are diagrams illustrating a process of attaching solder balls using a ball attachment apparatus according to an embodiment of the present inventive concept.

Referring to FIG. 9A, the solder ball attachment process using the ball attachment apparatus 100A according to an embodiment may be performed on a transfer table 10 configured to transfer the substrate strip ST in the first direction D1. The ball attachment apparatus 100A may be installed on the transfer table 10 to be lifted in the vertical direction D3. In addition, the ball attachment apparatus 100A may be installed to be movable in a horizontal direction (e.g., D2) in order to adsorb the solder balls. The substrate strip ST may be disposed on the transfer table 10 so that a length direction thereof matches a transfer direction of the transfer table 10. The ball attachment apparatus 100A may have a planar area covering the entire region of the substrate strip ST. The substrate strip ST may include a plurality of substrate units UT and ball pads bp. The plurality of substrate units UT may have been shifted in a direction away from the center CL2 of the substrate strip ST due to thermal stress.

Figure 9B:
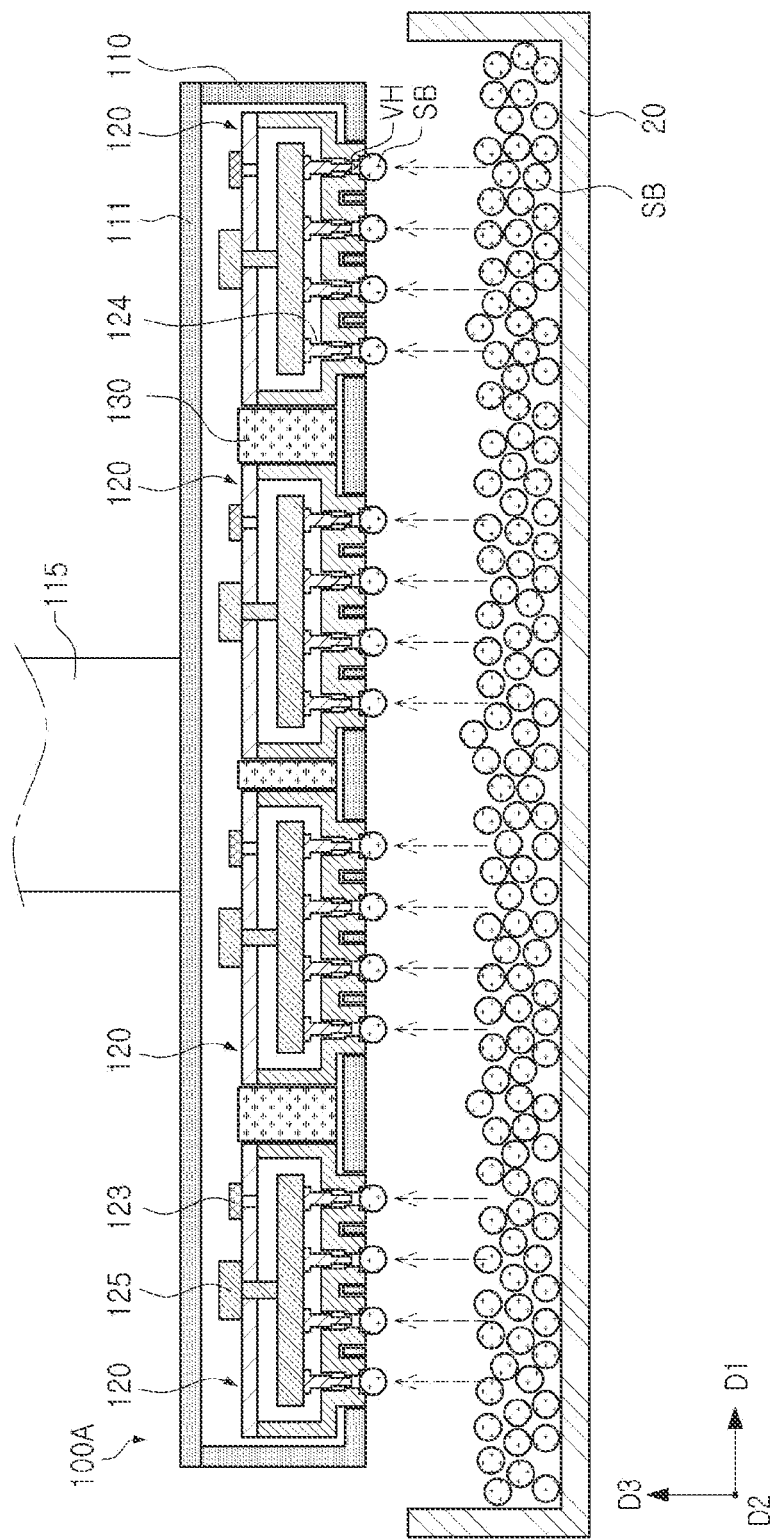

Referring to FIG. 9B, the ball attachment apparatus 100A may be moved to the solder ball box 20 to pick up solder balls SB. The solder balls SB may be adsorbed to the plurality of holding tools 120 by suction pressure (or vacuum pressure) applied to the adsorption holes VH. The solder balls SB may be sucked and fixed to the adsorption holes VH one by one. According to an embodiment, the solder ball box 20 may vibrate up and down and/or left and right to facilitate adsorption of the solder balls SB. At this time, the pressing pins 124 may be moved upwardly so as not to contact the solder balls SB.

Figure 9C:
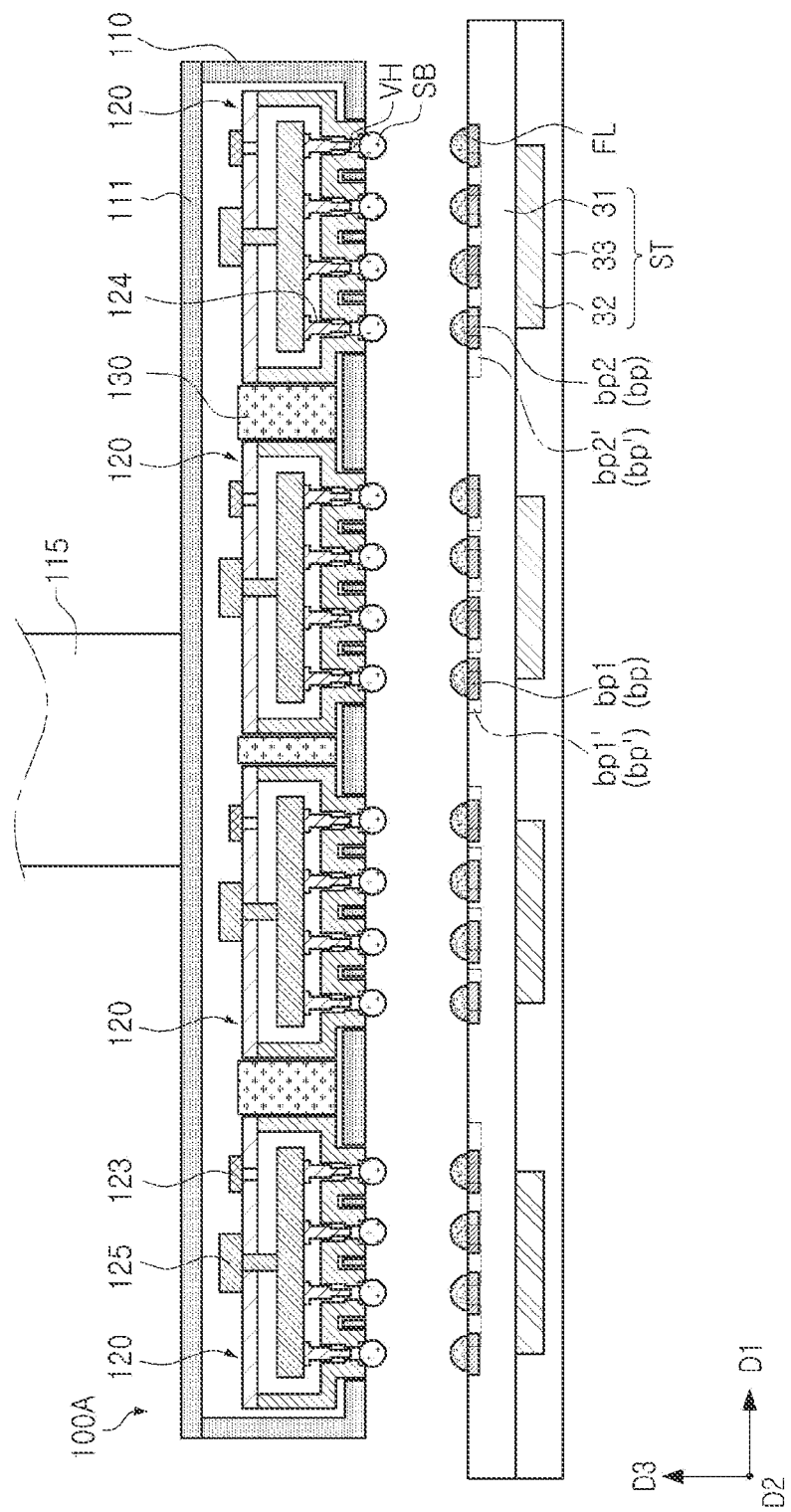

Referring to FIG. 9C, the ball attachment apparatus 100A may be moved above the substrate strip ST. In the ball attachment apparatus 100A, the center of the tool case 110 may be aligned with the center of the substrate strip ST, and the solder balls SB may be located to be vertically close to the ball pads bp. The substrate strip ST may include a substrate portion 31 to which the solder balls SB are attached, a plurality of semiconductor chips 32 mounted on a lower surface of the substrate portion 31, and a molded portion 33 sealing the plurality of semiconductor chips 32. The plurality of semiconductor chips 32 may be arranged to correspond to the plurality of substrate units UT, respectively. The ball pads bp may be arranged on an upper surface of the substrate portion 31. Flux FL may be dotted on the ball pads bp before the solder ball attachment process is performed. The substrate strip ST may be in a deformed state due to thermal stress applied during the previous processes of, for example, mounting the semiconductor chips 32 and forming the molded portion 33. That is, the ball pads bp may have been shifted from a position of initial ball pads bp'. Also, the second ball pads bp2 close to the edge of the substrate strip ST may be shifted more than the first ball pads bp1 that are closer to the center of the substrate strip ST. For example, a shift interval between first initial ball pad bp1' and first ball pad bp1 may be smaller than a shift interval between second initial ball pad bp2' and second ball pad bp2.

According to the present inventive concept, the alignment of the solder balls SB and the ball pads bp may be improved by adjusting the intervals between the plurality of holding tools 120 to be different in response to the deformation of the substrate strip ST. In addition, productivity may be improved by attaching the solder balls SB to the entire substrate strip ST through a single solder ball attachment process.

Figure 9D:
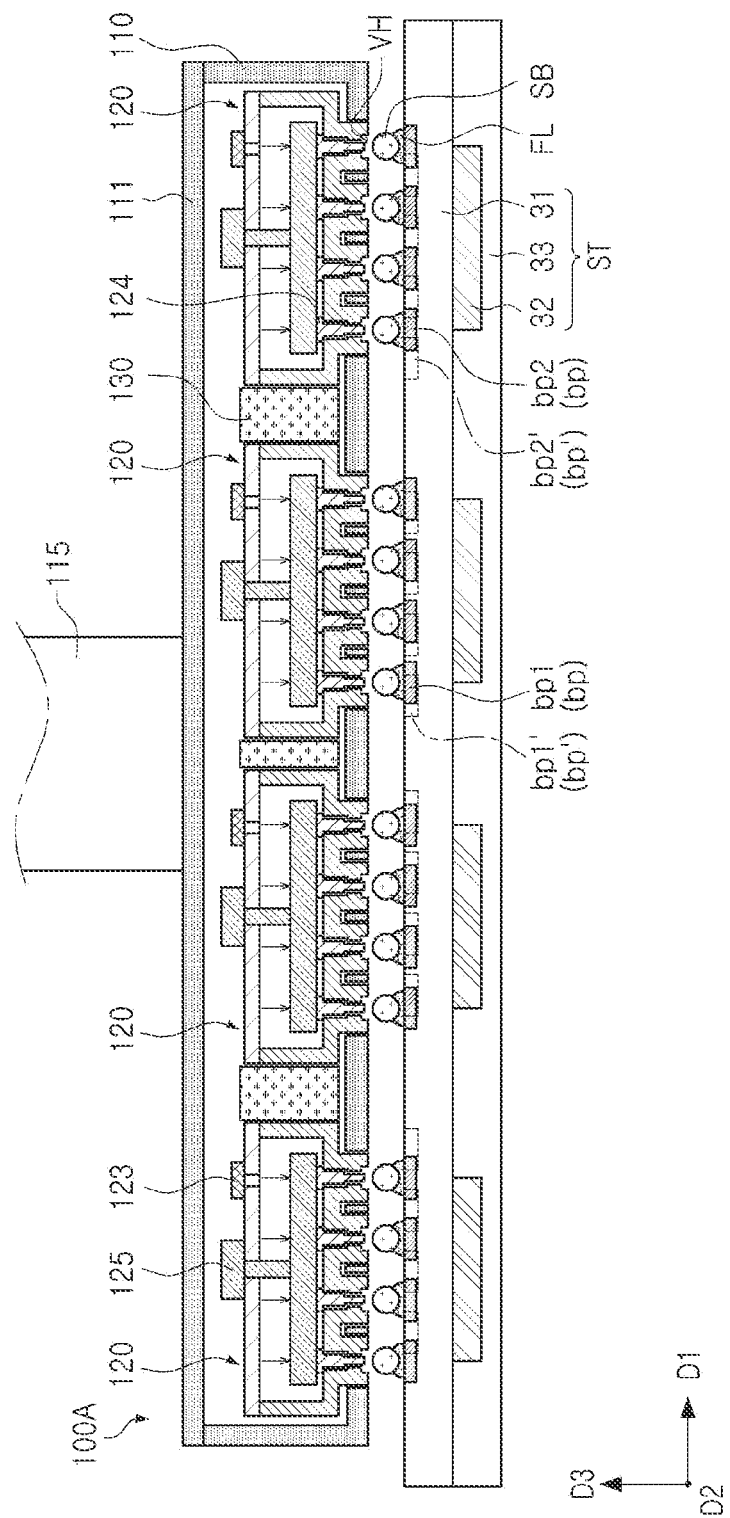

Referring to FIG. 9D, the solder balls SB separated from the ball attachment apparatus 100A may be attached to the ball pads bp. The solder balls SB may fall on the ball pads bp as suction pressure applied to the adsorption holes VH is removed by the pressure adjusting portion 123. The pressing pins 124 pressed downwardly by the lifting driving portion 125 may push the solder balls SB, while descending through the adsorption holes VH. The ball attachment apparatus 100A may separate the plurality of holding tools 120 in a main extending direction (the length direction) of the substrate strip ST, thereby improving alignment of the solder balls SB and the ball pads bp and improving productivity.

According to the embodiments of the present inventive concept, the ball attachment apparatus may be capable of improving alignment of the solder balls and ball pads and improving productivity by adjusting the intervals of the solder ball holding tools to be different.

While example embodiments have been shown and described above, it will be apparent to those skilled in the art that modifications and variations could be made without departing from the scope of the present inventive concept as defined by the appended claims.

What is claimed is:

1. A ball attachment apparatus comprising:
 a tool case having a bottom surface on which solder balls are adsorbed, the solder balls being for attachment to a substrate strip comprising a plurality of substrate units;
 a plurality of holding tools in the tool case spaced apart from each other in a first direction, each of the plurality of holding tools comprising a plurality of holding regions and each of the plurality of holding regions comprising adsorption holes, the plurality of holding regions respectively corresponding to the plurality of substrate units and the adsorption holes arranged to respectively correspond to ball pads of the plurality of substrate units; and
 a plurality of insertion blocks respectively disposed between adjacent ones of the plurality of holding tools,
 wherein, among gaps between adjacent ones of the plurality of holding tools, a first gap at a first distance from a center of the tool case is different from at least one second gap at a second distance greater than the first distance from the center of the tool case.

2. The ball attachment apparatus of claim 1, wherein the tool case comprises:
 a plurality of tool arrangement regions respectively aligned with the plurality of holding tools;
 a plurality of unit regions aligned with the plurality of holding regions of each of the plurality of holding tools; and
 accommodating holes aligned with the adsorption holes within the plurality of unit regions.

3. The ball attachment apparatus of claim 2, wherein gaps between adjacent ones of the plurality of tool arrangement regions are vertically aligned with the gaps between the adjacent ones of the plurality of holding tools.

4. The ball attachment apparatus of claim 1, wherein
 the plurality of holding regions are arranged in a plurality of rows extending in the first direction and at least one column extending in a second direction, different from the first direction, and
 a number of the plurality of rows is greater than a number of the at least one column.

5. The ball attachment apparatus of claim 1, wherein each of the plurality of holding tools further comprises a pressure adjusting portion configured to apply a vacuum pressure to the adsorption holes.

6. The ball attachment apparatus of claim 1, wherein each of the plurality of holding tools further comprises pressing pins respectively arranged in the adsorption holes and a lifting driving portion configured to raise and lower the pressing pins.

7. The ball attachment apparatus of claim 1, wherein the tool case has an elongated shape in the first direction.

8. The ball attachment apparatus of claim 1, wherein
 the plurality of insertion blocks comprise a first insertion block disposed in the first gap and a second insertion block disposed in the at least one second gap, and
 a width of the first insertion block in the first direction is different from a width of the second insertion block in the first direction.

9. The ball attachment apparatus of claim 8, wherein at least one of the first insertion block and the second insertion block comprises a plurality of block layers stacked in the first direction.

10. The ball attachment apparatus of claim 1, wherein widths of the plurality of holding tools in the first direction are the same.

11. The ball attachment apparatus of claim 1, wherein one of the plurality of insertion blocks vertically overlaps the center of the tool case.

12. The ball attachment apparatus of claim 1, wherein one of the plurality of holding tools vertically overlaps the center of the tool case.

13. The ball attachment apparatus of claim 1, wherein the tool case has a left edge and a right edge spaced apart from each other in the first direction, and a number of left holding tools arranged between the center and the left edge of the tool case in the first direction, among the plurality of holding tools, is the same as a number of right holding tools arranged between the center and the right edge of the tool case, among the plurality of holding tools.

14. The ball attachment apparatus of claim 13, wherein a left gap closest to the left edge among gaps between adjacent ones of the left holding tools is different from a right gap closest to the right edge, among gaps between adjacent ones of the right holding tools.

15. The ball attachment apparatus of claim 1, further comprising a coupling member arranged in the first direction, the coupling member configured to adhere and fix the plurality of holding tools and the plurality of insertion blocks.

16. A ball attachment apparatus comprising:
a tool case;
a plurality of holding tools in the tool case spaced apart from each other, each of the plurality of holding tools comprising adsorption holes configured to adsorb solder balls; and
a plurality of insertion blocks respectively disposed between the plurality of holding tools,
wherein at least some of the plurality of insertion blocks have different widths from each other in an arrangement direction of the plurality of holding tools.

17. The ball attachment apparatus of claim 16, wherein an insertion block closest to the center of the tool case, among the plurality of insertion blocks, has a width different from a width of at least one block adjacent to an edge of the tool case in the arrangement direction.

18. The ball attachment apparatus of claim 16, wherein the tool case comprises accommodating holes vertically aligned with the adsorption holes.

19. A ball attachment apparatus comprising:
a tool case;
a plurality of holding tools in the tool case spaced apart from each other, the plurality of holding tools being configured to adsorb solder balls; and
a plurality of insertion blocks respectively disposed between adjacent ones of the plurality of holding tools,
wherein a gap between adjacent ones of the plurality of holding tools is different from at least one other gap farther from the center of the tool case than the gap in an arrangement direction of the plurality of holding tools.

20. The ball attachment apparatus of claim 19, wherein the plurality of insertion blocks have widths respectively corresponding to gaps between adjacent ones of the plurality of holding tools.

* * * * *